United States Patent
Hsu et al.

(10) Patent No.: US 7,218,554 B2
(45) Date of Patent: May 15, 2007

(54) METHOD OF REFRESHING CHARGE-TRAPPING NON-VOLATILE MEMORY USING BAND-TO-BAND TUNNELING HOT HOLE (BTBTHH) INJECTION

(75) Inventors: Cheng-Hsing Hsu, Hsinchu (TW); Chao-I Wu, Hsinchu (TW); Hao-Ming Lien, Hsinchu (TW); Ming-Hsiang Hsueh, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 23 days.

(21) Appl. No.: 11/160,097

(22) Filed: Jun. 8, 2005

(65) Prior Publication Data

US 2006/0279997 A1    Dec. 14, 2006

(51) Int. Cl.
*G11C 16/04*    (2006.01)
(52) U.S. Cl. .................... 365/185.25; 365/185.28; 365/185.02; 365/185.09; 365/185.19
(58) Field of Classification Search .......... 365/185.25, 365/185.28, 185.02, 185.09, 185.19
See application file for complete search history.

(56) References Cited

U.S. PATENT DOCUMENTS

| | | | | |
|---|---|---|---|---|
| 4,250,569 A | * | 2/1981 | Sasaki et al. ............... | 365/182 |
| 4,881,203 A | * | 11/1989 | Watanabe et al. ........... | 365/203 |
| 6,011,725 A | | 1/2000 | Eitan ..................... | 365/185.33 |
| 6,636,440 B2 | | 10/2003 | Maayan et al. ........ | 365/185.25 |
| 6,700,155 B1 | * | 3/2004 | King et al. ................. | 257/321 |
| 6,967,611 B2 | * | 11/2005 | Atriss et al. ................ | 341/172 |
| 2005/0270849 A1 | * | 12/2005 | Lue ........................ | 365/185.28 |
| 2006/0146603 A1 | * | 7/2006 | Kuo et al. ................... | 365/177 |

* cited by examiner

*Primary Examiner*—Andrew Q. Tran
(74) *Attorney, Agent, or Firm*—J.C. Patents

(57) ABSTRACT

A method of using a non-volatile memory that utilizes a charge-trapping layer for data storage is described. A refresh step is performed, after the non-volatile memory is subject to multiple write/erase cycles causing hard-to-erase electrons in the charge-trapping layer, to eliminate the hard-to-erase electrons. After the refresh step, the non-volatile memory is used again.

17 Claims, 4 Drawing Sheets

METHOD OF REFRESHING CHARGE-TRAPPING NON-VOLATILE MEMORY USING BAND-TO-BAND TUNNELING HOT HOLE (BTBTHH) INJECTION

BACKGROUND OF THE INVENTION

1. Field of the Invention

The present invention relates to a method of using a semiconductor device. More particularly, the present invention relates to a method of using a non-volatile memory and a refresh method of a non-volatile memory, which are applied to a non-volatile memory that utilizes a charge-trapping layer for data storage.

2. Description of the Related Art

Recently, electrically erasable programmable read-only memory ($E^2$PROM) and flash memory as members of non-volatile memory are widely used in various electronic products. Conventional $E^2$RPOM and flash memory devices use floating gates (FG) to store charges, and therefore store merely one bit in each memory cell.

To increase the storage density of programmable non-volatile memory, a new type of non-volatile memory using charge-trapping layers to store N bits (N≧2) per cell is proposed. For example, U.S. Pat. No. 6,011,725 discloses a nitride read-only memory, which uses a nitride layer for trapping charges and is capable of storing two bits in each memory cell. Referring to FIG. 1A, an N-bit memory cell usually includes a charge trapping layer 120 between two dielectric layers 110 and 130, wherein the three layers 110–130 are between the substrate 100 and the gate 140.

An N-bit cell is usually written with channel hot electron injection (CHEI). When the channel current is from the source/drain (S/D) region 150 to the S/D region 160, hot electrons are produced in the channel region near the S/D region 150 and attracted to the corresponding portion of the above charge trapping layer 120 near the S/D region 150 by a high positive voltage applied to the gate 140. On the contrary, when the channel current is from 160 to 150, hot electrons are attracted to a portion of the charge trapping layer 120 near the S/D region 160. Accordingly, by altering the relative polarity between the two S/D regions 150 and 160 to switch the direction of the channel current, two bits can be written to a single N-bit cell.

Referring to FIG. 1B, an N-bit cell having been written through CHEI is usually erased by injecting holes to the storage sites containing electrons through band-to-band tunneling hot hole (BTBTHH) effect. If the two storage sites in one memory cell both contain electrons, the erase operation has to be conducted twice, i.e., from the left side and the right side respectively, to inject holes into the left storage site and the right storage site, respectively.

However, as CHEI is utilized to locally inject hot electrons, there is still a minor amount of hot electrons entering the middle portion of the charge trapping layer 120 and being trapped therein, as shown in FIG. 1A. Since no hole enters the middle portion of the charge trapping layer 120 in the erase operation utilizing BTBTHH effect, the electrons trapped therein will not be annihilated, as shown in FIG. 1B. Therefore, after a lot of such write/erase cycles, quite a few hard-to-erase electrons are accumulated in the middle portion, as shown in FIG. 1C. As a result, the erase-state (low-level) threshold voltage (Vt) of the memory cell is progressively raised with the number of write/erase cycles, so that the operation window ($=Vt_{write}-Vt_{erase}$) is gradually decreased, as shown in FIG. 5.

SUMMARY OF THE INVENTION

Accordingly, this invention provides a method of using a trapping-type non-volatile memory to prevent the operation window of the non-volatile memory from being gradually decreased with the number of write/erase cycles.

This invention also provides a refresh method of a non-volatile memory, which is capable of eliminate the hard-to-erase electrons accumulated in the charge-trapping layer to prevent narrowing of the operation window of the non-volatile memory.

In the method, the non-volatile memory includes a substrate, a gate, a charge-trapping layer between the substrate and the gate, and a first and a second doped regions as source/drain regions. The method includes the following steps (a)–(c). In step (a), multiple electron-write/hole-erase cycles are performed to the non-volatile memory, while hard-to-erase electrons are caused to accumulate in a specific portion of the charge-trapping layer. In step (b), the erase-state Vt of the non-volatile memory is measured to determine whether the difference between the measured erase-state Vt and the initial erase-state Vt of the non-volatile memory exceeds a predetermined value or not. In step (c), if the difference does not exceed the predetermined value, the process is redirected to step (a); if the difference exceeds the predetermined value, a refresh step is conducted to eliminate the hard-to-erase electrons and then the process is redirected to step (a).

In a preferred embodiment, the refresh step includes injecting holes into the specific portion of the charge-trapping layer.

In some embodiments, the non-volatile memory is one having two storage sites per cell. The two storage sites are located respectively at a first portion and a second portion of the charge-trapping layer near the first doped region and the second doped region, respectively, while the specific portion of the charge-trapping layer where the hard-to-erase electrons are accumulated is a middle portion of the charge-trapping layer between the first portion and the second portion of the charge-trapping layer. Meanwhile, the refresh step includes injecting holes into the middle portion of the charge-trapping layer. In such cases, the refresh step may utilize BTBTHH effect to inject holes into the middle portion of the charge-trapping layer.

The method of utilizing BTBTHH effect to inject holes may include the following steps, for example. At first, certain voltages are applied to the gate, the substrate and the first doped region, respectively, such that BTBTHH effect is induced and holes are injected into a first sub-portion of the middle portion of the charge-trapping layer near the first doped region. The same voltages are then applied to the gate, the substrate and the second doped region, respectively, to induce BTBTHH effect and inject holes to a second sub-portion of the middle portion of the charge-trapping layer near the second doped region.

In the above method of utilizing BTBTHH effect to inject holes, the voltage applied to each of the gate and the first and second doped regions may have a form of multiple pulses. As compared with the erase operation in the write/erase cycles that utilizes BTBTHH effect with a gate voltage for erasing and a drain voltage for erasing, the height of each pulse applied to the gate is higher than the gate voltage for erasing, and the height of each pulse applied to the first or second doped region is higher than the drain voltage for erasing.

Moreover, the series of pulses applied to the gate, the first doped region or the second doped region may be increased stepwise in height or fixed in height.

Furthermore, the multiple write/erase cycles may be one or more thousands of write/erase cycles, and the predetermined value set in step (b) for determining whether the refresh step is conducted or not is, for example, about 0.2V.

The refresh method of a non-volatile memory of this invention is conducted after the non-volatile memory is subject to multiple electron-write/hole-erase cycles so that hard-to-erase electrons are accumulated in a specific portion of the charge-trapping layer of the non-volatile memory, including a step of injecting holes into the specific portion of the charge-trapping layer to annihilate the hard-to-erase electrons. Other features of the refresh method have been described above.

Since this invention performs a refresh step to annihilate the hard-to-erase electrons accumulated in the charge-trapping layer after the non-volatile memory is subject to multiple write/erase cycles, the erase-state Vt of the memory cell will not raised progressively with the number of write/erase cycles. Consequently, the operation window of the non-volatile memory will not be gradually decreased.

It is to be understood that both the foregoing general description and the following detailed description are exemplary, and are intended to provide further explanation of the invention as claimed.

BRIEF DESCRIPTION OF THE DRAWINGS

FIG. 1A/1B illustrates a two-side write/erase operation of a trapping-type non-volatile memory in the prior art, while

DESCRIPTION OF THE PREFERRED EMBODIMENTS

Figure 2:
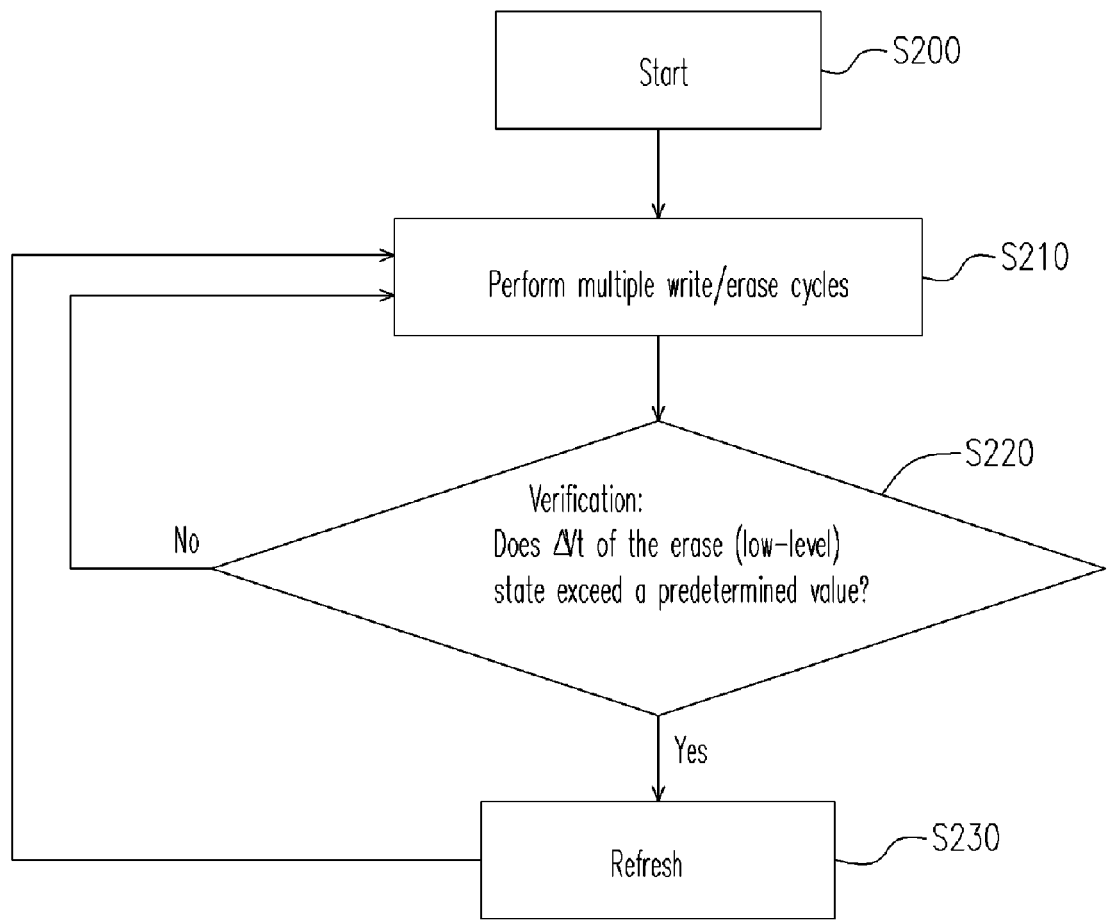
FIG. 2 illustrates a flow chart of a method of using a non-volatile memory according to a preferred embodiment of this invention.

FIG. 2 illustrates a flow chart of a method of using a non-volatile memory according to the preferred embodiment of this invention. After the non-volatile memory is provided (S200), multiple write/erase cycles are performed to the non-volatile memory (S210). The write operation in one cycle may utilize CHEI effect to locally inject electrons into the charge-trapping layer of the non-volatile memory, and the erase operation may utilize BTBTHH effect to locally inject holes into the charge-trapping layer, such that quite a few hard-to-erase electrons are accumulated in the charge-trapping layer.

For a two-storage-site non-volatile memory cell that stores charges in two portions of the charge-trapping layer near the two S/D regions, such as an N-bit cell, when the storage site at one side is to be written through CHEI, the gate, the S/D of the same side, the other S/D and the substrate may be applied with, for example, 11V, 5V, 0V and 0V, respectively. When the storage site at one side is to be erased through BTBTHH, the gate, the S/D of the same side, the other S/D and the substrate may be applied with, for example, –5V, 5V, 0V and 0V, respectively.

Figure 1A:
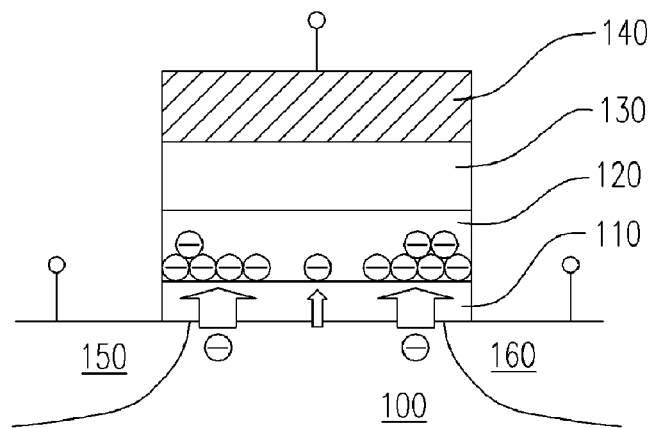
Figure 1B:
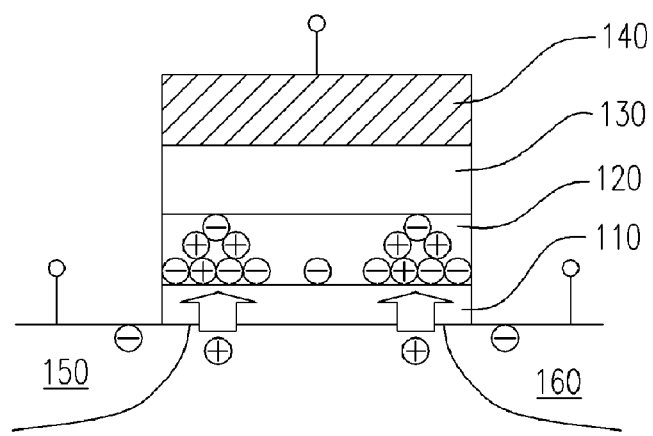
Figure 1C:
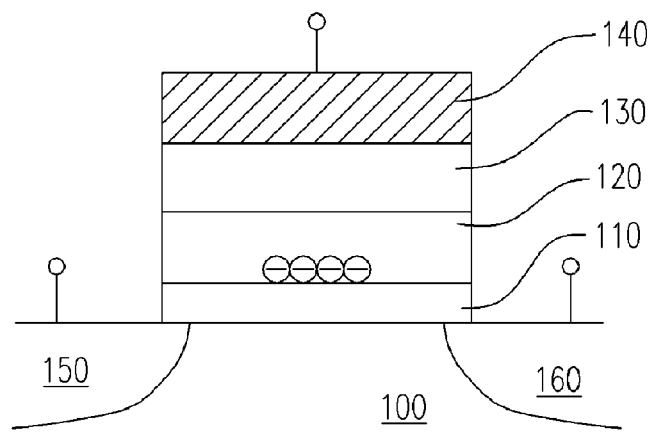
FIG. 1C illustrates accumulation of hard-to-erase electrons in the middle portion of the charge-trapping layer.

In addition, for a two-storage-site non-volatile memory cell like an N-bit cell, the hard-to-erase electrons are accumulated in a middle portion of the charge-trapping layer between the two storage sites, as shown in FIG. 1C.

After the write/erase cycles, a verification step is performed for determining whether a refresh step is required or not. Specifically, in the verification step, the erase-state (low-level) Vt of the non-volatile memory is measured to determine whether the difference between the measured erase-state Vt and the initial erase-state Vt of the no-volatile memory, which is abbreviated to "ΔVt of the erase state" in FIG. 2, exceeds a predetermined value or not. The predetermined value is namely a tolerable voltage difference for the operation window of the memory, such as, 0.2V. If the difference does not exceed the predetermined value, the process is redirected to step S210 to continue using the non-volatile memory. If the difference exceeds the predetermined value, a refresh step S230 is conducted to eliminate the hard-to-erase electrons in the charge-trapping layer, and then the process is redirected to step S210 to continue using the non-volatile memory.

The refresh step S230 may include a step of injecting holes into the portion of the charge-trapping layer with hard-to-erase electrons accumulated therein to annihilate the electrons. In such cases, when the non-volatile memory cell is one that stores charges in two portions of the charge-trapping layer near the two S/D regions like an N-bit cell, the refresh step S230 may inject holes into the middle portion of the charge-trapping layer, possibly through BTBTHH effect, to annihilate the hard-to-erase electrons accumulated therein.

Figure 3A:
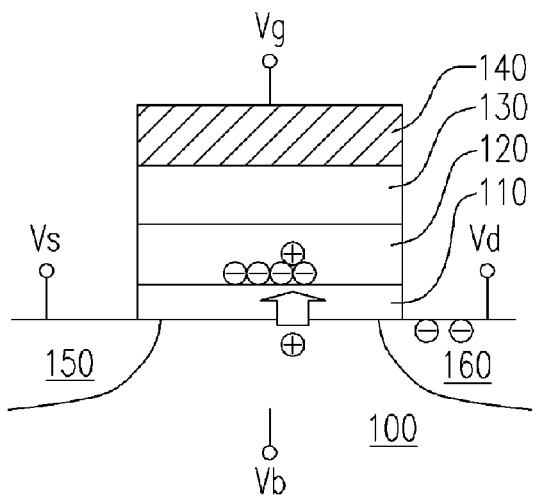
FIGS. 3A and 3B illustrate an example of the refresh method of this invention.
Figure 3B:
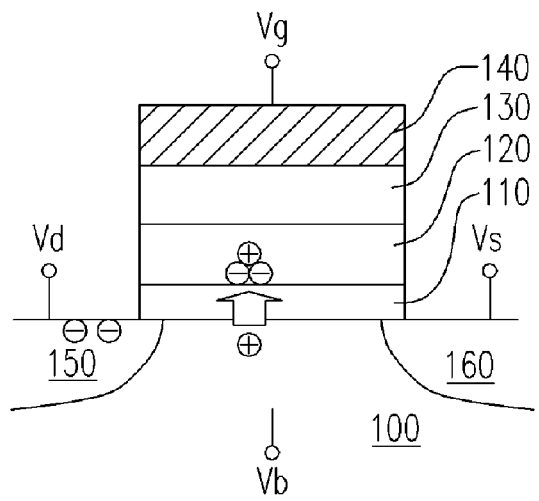

Referring to FIGS. 3A and 3B, when BTBTHH effect is utilized for the refresh step, the refresh step may include the following steps, for example. At first, a negative voltage Vg more negative than the gate voltage used for BTBTHH-erasing operation is applied to the gate 140, a positive voltage Vd more positive than the drain voltage for BTBTHH-erasing operation is applied to the right S/D region 160, and 0V (Vs and Vb) is applied to the left S/D region 150 and the substrate 100, respectively. Thereby, hot holes are generated under the right half of the middle portion of the charge-trapping layer 120 and are injected into the same part of the charge-trapping layer 120 to annihilate the hard-to-erase electrons therein, as shown in FIG. 3A. In addition, the gate voltage and the drain voltage for the BTBHHH-erasing operation may be –5V and 5V, respectively.

Thereafter, the same Vg is applied to the gate 140, the same Vd is applied to the left S/D region 150 instead of to the right S/D 160, and 0V (Vs and Vb) is applied to the right S/D region 160 and the substrate 100, respectively. Thereby, hot holes are generated under the left half of the middle portion of the charge-trapping layer 120 and are injected into the same part of the charge-trapping layer 120 to annihilate the hard-to-erase electrons therein, as shown in FIG. 3B. Of course, the order of the two steps respectively shown in FIG. 3A and FIG. 3B can be readily reversed to firstly annihilate the hard-to-erase electrons in the left half of the middle portion of the charge-trapping layer 120 and then annihilate the hard-to-erase electrons in the right half of the same.

In any stage of the two-stage refresh step shown in FIGS. 3A and 3B, each of Vg and Vd is preferably applied in the form of multiple pulses, wherein the height of each pulse applied to the gate 140 is higher than the gate voltage for a BTBTHH-erasing operation, and the height of each pulse applied to the left or right S/D region 150 or 160 is higher than the drain voltage for a BTBTHH-erasing operation. Thus, a verification step can be performed after each pulse is applied to measure the erase-state Vt of the non-volatile memory and determine whether the difference between the measured erase-state Vt and the initial erase-state Vt of the non-volatile memory is smaller than a predetermined value (e.g., 0.2V). By stop applying pulses once the difference is detected to be smaller than the predetermined value, the charge-trapping layer will not be injected with excess holes to overly lower the erase-state (low-level) Vt of the non-volatile memory.

In addition, the sequence of pulses applied to the gate 140, the left S/D region 150 or the right S/D region 160 may be increased stepwise in height. Specifically, the height of any pulse is higher than that of the precedent pulse by a constant value. For example, the height of the negative voltage pulses applied to the gate 140 may be increase stepwise with a step of −0.5V, and the height of the positive voltage pulses applied to the left or right S/D region 150 or 160 may be increase stepwise with a step of 0.1V. The height of each pulse may alternatively be fixed. For example, the height of each negative voltage pulse applied to the gate 140 may be fixed at −14V, and the height of each positive voltage pulse applied to the left or right S/D region 150 or 160 may be fixed at 7.7V.

The following experiment results are provided to demonstrate the effects of this invention.

<Experiment 1>

In this experiment, the charge-trapping layer of an N-bit cell is uniformly injected with electrons through Fowler-Nordheim tunneling (FNT) to simulate a charge-trapping layer with hard-to-erase electrons accumulated at its middle portion. The initial erase-state Vt of the N-bit cell is 1.9V, and the Vt of the same after FNT is 5.0V.

Figure 4A:
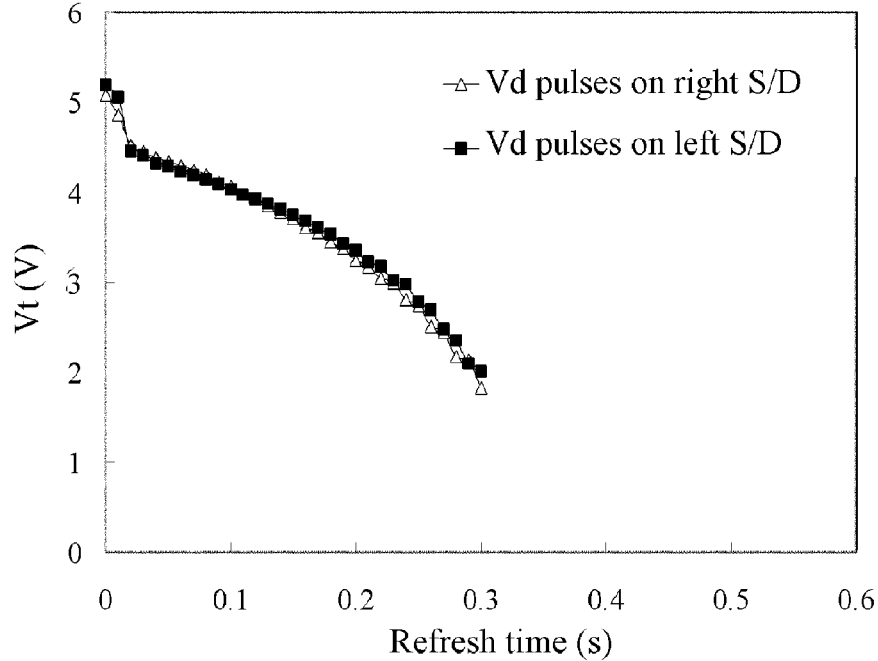
FIG. 4A/4B shows the results of applying pulses with stepwise-increased/fixed height to refresh a trapping-type non-volatile memory, wherein electrons have been injected into the charge-trapping layer of the same through Fowler-Nordheim tunneling (FNT) to simulate hard-to-erase electrons.

FIG. 4A/4B shows the results of applying pulses with stepwise-increased/fixed height to refresh the N-bit cell having been injected with electrons through FNT. In the graphs, the refresh time is the accumulative total of the pulses having been applied, and the Vt of the N-bit cell is measured after each pulse is applied. For the experiment corresponding to any of FIGS. 4A and 4B, two parts are included. The first part is to apply Vd pulses to the left S/D and measure the channel current from the right S/D to determine the Vt of the left half of the channel, and the second part is to apply Vd pulses to the right S/D and measure the channel current from the left S/D to determine the Vt of the right half of the channel. As the channel current is measured from the left (right) S/D after a pulse is applied, the voltage applied to the left (right) S/D is sufficiently high, so that the measurement is not affected by the electrons injected into the left (right) half of the charge-trapping layer. Thus, the current measurement can be utilized to determine specifically the Vt of the right (left) half of the channel, so that the degree of electron annihilation in the right (left) half of the charge-trapping layer can be monitored specifically. Moreover, since the distribution of the electrons injected into the charge-trapping layer through FNT is symmetrical in left and right, the results of the two parts of the experiment shown in FIG. 4A or 4B are approximately the same.

Referring to FIG. 4A, the pulse width set in the experiment is 10 ms, the initial value of the negative gate voltage (Vg) pulses is −8V, and each pulse applied later is negatively higher than the precedent one by −0.5V. The initial value of the positive drain voltage (Vd) pulses is 6V, and each pulse applied later is higher than the precedent one by 0.1V. As shown in FIG. 4A, the refresh method using pulses increased stepwise in height can make the Vt of the N-bit cell having been subject to FNT electron injection gradually fall from the high voltage of 5.0V after the FNT injection to the low voltage of 1.9V before the FNT injection. This means that the electrons in the middle portion of the charge-trapping layer have been annihilated.

Figure 4B:
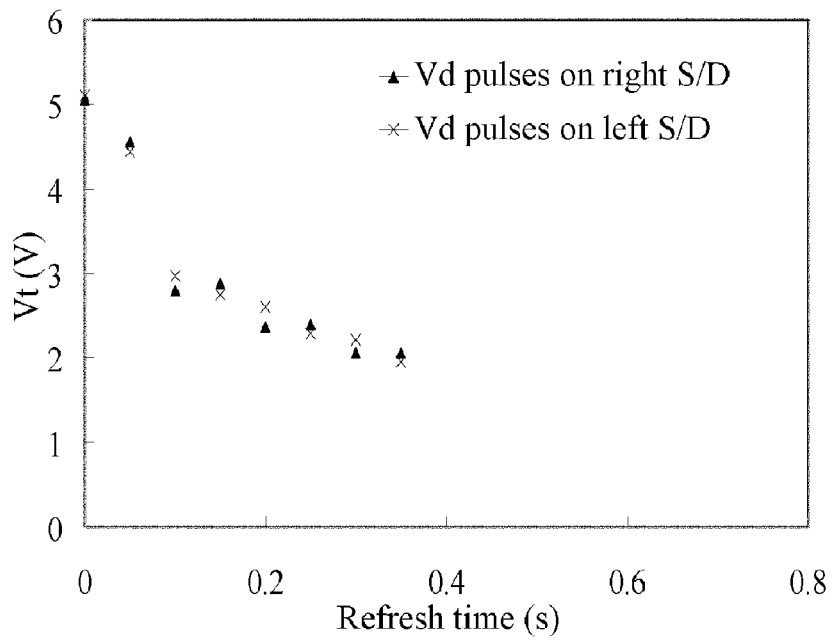

Referring to FIG. 4B, the pulse width set in the experiment is 50 ms, the height of the negative Vg pulses is fixed at −14V, and the height of the positive Vd pulses is fixed at 7.7V. As shown in FIG. 4B, the refresh method using pulses of fixed height can also make the Vt of the N-bit cell having been subject to FNT electron injection gradually fall from 5.0V to 1.9V. This means that the electrons in the middle portion of the charge-trapping layer have been annihilated.

Accordingly, no matter the height of the pulses applied is increased stepwise or fixed, the refresh method of this invention can effectively annihilate the electrons in the middle portion of the charge-trapping layer. Therefore, the refresh method can be applied to a two-storage-site non-volatile memory, which has been subject to multiple write/erase cycles and therefore contains hard-to-erase electrons in the middle portion of its charge-trapping layer, to annihilate the hard-to-erase electrons and allow normal use of the non-volatile memory.

<Experiment 2>

Figure 5:
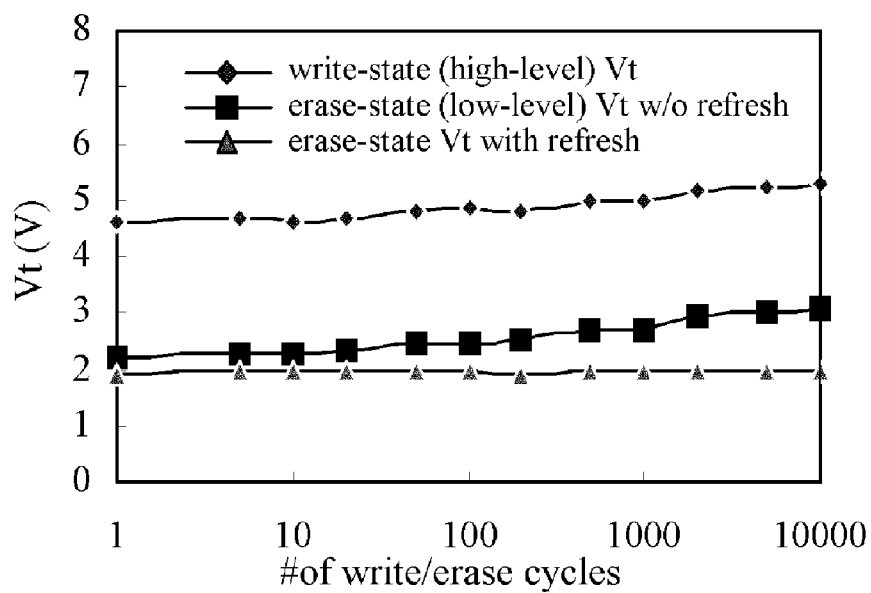
FIG. 5 shows the changes of write-state Vt and erase-state Vt with the number of write/erase cycles in an example of this invention, wherein a refresh step is conducted after each time of Vt verification.

Referring to FIG. 5, in this experiment, the Vt of a trapping-type non-volatile memory is verified respectively after the fifth, tenth, 30-th, 50-th . . . 3000-th, 5000-th and 10000-th CHEI-write/BTBTHH-erase cycle, while a refresh step similar to that mentioned in Experiment 1 is performed after each verification step before the memory is used again. As compared with the erase-state (low-level) Vt curve without refresh, the method of this invention can actually prevent the erase-state (low-level) Vt from being progressively increased with the number of write/erase cycles and thereby prevent the operation window of the non-volatile memory from being decreased gradually.

Figure 6:
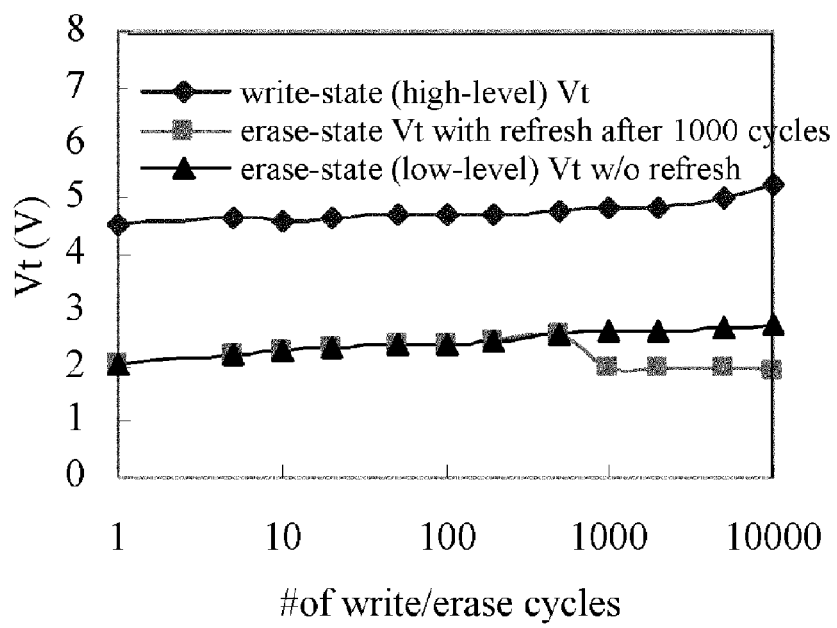
FIG. 6 shows the changes of write-state Vt and erase-state Vt with the number of write/erase cycles in another example of this invention, wherein refresh is not conducted until the number of write/erase cycles reaches 1000.

Moreover, as shown in FIG. 5, the erase-state (low-level) Vt without refresh is not high enough to affect normal operation before the number of write/erase cycles reaches 1000. Therefore, in ordinary use of the non-volatile memory, it is feasible to begin refreshing the non-volatile memory after the number of write/erase cycles reaches one or more thousands. As shown in FIG. 6, though the refresh step is performed merely after the 1000-th, 3000-th, 5000-th and 10000-th write/erase cycle, the operation window of the non-volatile memory can still be effectively prevented from being decreased gradually.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of using a non-volatile memory that includes a substrate, a gate, a charge-trapping layer between the substrate and the gate, and a first and a second doped regions as source/drain regions, comprising:
   (a) performing a plurality of write/erase cycles to the non-volatile memory with electron-injection/hole-injection, while hard-to-erase electrons are accumulated in a specific portion of the charge-trapping layer during the write/erase cycles; and
   (b) measuring an erase-state threshold voltage (Vt) of the non-volatile memory to determine whether a difference between the erase-state Vt and an initial erase-state Vt of the non-volatile memory exceeds a predetermined value or not; and
   (c) going to step (a) if the difference does not exceed the predetermined value, or performing a refresh step that utilizes band-to-band tunneling hot hole (BTBTHH) effect to inject holes into the specific portion of the charge-trapping layer to annihilate the hard-to-erase electrons and then going to step (a) if the difference exceeds the predetermined value.

2. The method of claim 1, wherein
   the non-volatile memory has two storage sites respectively at a first portion and a second portion of the charge-trapping layer near the first doped region and the second doped region, respectively; and
   the specific portion of the charge-trapping layer is a middle portion of the charge-trapping layer between the first portion and the second portion of the charge-trapping layer.

3. The method of claim 2, wherein the method of utilizing BTBTHH effect to inject holes into the middle portion of the charge-trapping layer comprises:
   applying voltages to the gate, the substrate and the first doped region, such that BTBTHH effect is induced and holes are injected into a first sub-portion of the middle portion of the charge-trapping layer near the first doped region; and
   applying voltages to the gate, the substrate and the second doped region, such that BTBTHH effect is induced and holes are injected into a second sub-portion of the middle portion of the charge-trapping layer near the second doped region.

4. The method of claim 3, wherein
   during the write/erase cycles, BTBTHH effect is utilized for erasing, wherein a gate voltage for erasing and a drain voltage for erasing are used;
   in the refresh step, the voltage applied to each of the gate and the first and second doped regions is in a form of multiple pulses;
   a height of each pulse applied to the gate is higher than the gate voltage for erasing; and
   a height of each pulse applied to the first or second doped region is higher than the drain voltage for erasing.

5. The method of claim 4, wherein the refresh step further comprises:
   measuring an erase-state Vt of the non-volatile memory after each pulse is applied; and
   stopping applying the pulses when the difference between the measured erase-state Vt and the initial erase-state Vt of the non-volatile memory is smaller than the predetermined value.

6. The method of claim 5, wherein the pulses applied to the gate, the first doped region or the second doped region are increased stepwise in height.

7. The method of claim 5, wherein the pulses applied to the gate, the first doped region or the second doped region are fixed in height.

8. The method of claim 1, wherein the plurality of write/erase cycles comprises one or more thousands of write/erase cycles.

9. The method of claim 1, wherein the predetermined value in step (b) is about 0.2V.

10. A method of refreshing a non-volatile memory that includes a substrate, a gate, a charge-trapping layer between the substrate and the gate, and a first and a second doped regions as source/drain regions and has been subject to a plurality of write/erase cycles using electron/hole injection so that hard-to-erase electrons are accumulated in a specific portion of the charge-trapping layer, comprising:
    inducing band-to-band tunneling hot hole (BTBTHH) effect in the substrate; and
    injecting holes into the specific portion of the charge-trapping layer to annihilate the hard-to-erase electrons.

11. The method of claim 10, wherein
    the non-volatile memory has two storage sites respectively at a first portion and a second portion of the charge-trapping layer near the first doped region and the second doped region, respectively; and
    the specific portion of the charge-trapping layer is a middle portion of the charge-trapping layer between the first portion and the second portion of the charge-trapping layer.

12. The method of claim 11, wherein the method of utilizing BTBTHH effect to inject holes into the middle portion of the charge-trapping layer comprises:
    applying voltages to the gate, the substrate and the first doped region, such that BTBTHH effect is induced and holes are injected into a first sub-portion of the middle portion of the charge-trapping layer near the first doped region; and
    applying voltages to the gate, the substrate and the second doped region, such that BTBTHH effect is induced and holes are injected into a second sub-portion of the middle portion of the charge-trapping layer near the second doped region.

13. The method of claim 12, wherein
    during the write/erase cycles, BTBTHH effect is utilized for erasing, wherein a gate voltage for erasing and a drain voltage for erasing are used;
    in the refresh method, the voltage applied to each of the gate and the first and second doped regions is in a form of multiple pulses;
    a height of each pulse applied to the gate is higher than the gate voltage for erasing; and
    a height of each pulse applied to the first or second doped region is higher than the drain voltage for erasing.

14. The method of claim 13, further comprising:
    measuring an erase-state Vt of the non-volatile memory after each pulse is applied; and
    stopping applying the pulses when the difference between the measured erase-state Vt and an initial erase-state Vt of the non-volatile memory is smaller than a predetermined value.

15. The method of claim 14, wherein the pulses applied to the gate, the first doped region or the second doped region are increased stepwise in height.

16. The method of claim 14, wherein the pulses applied to the gate, the first doped region or the second doped region are fixed in height.

17. The method of claim 14, wherein the predetermined value is about 0.2V.

* * * * *